United States Patent
Orcutt et al.

[11] Patent Number: 5,215,940
[45] Date of Patent: Jun. 1, 1993

[54] WIRE LOOPING METHOD DURING WIRE BONDING

[76] Inventors: John W. Orcutt, 1800 N. Cheyenne, Richardson, Tex. 75080; Randy O. Burrows, 1838 Westcreek, Garland, Tex. 75042

[21] Appl. No.: 474,911

[22] Filed: Feb. 5, 1990

[51] Int. Cl.$^5$ ............................................. B23K 37/00
[52] U.S. Cl. ................................... 437/209; 228/4.5; 228/180.2; 437/220; 437/923
[58] Field of Search ............. 437/209, 220, 180, 8, 437/470, 923; 228/4.5, 180.2, 904; 140/102; 29/746

[56] References Cited

U.S. PATENT DOCUMENTS 3,819,102 6/1974 Isobe ............................. 228/904

FOREIGN PATENT DOCUMENTS

| | | |
|---|---|---|
| 211906 | 7/1984 | German Democratic Rep. ............................. 437/209 |
| 59-218745 | 12/1984 | Japan ............................. 437/209 |
| 60-98634 | 6/1985 | Japan ............................. 437/209 |
| 61-248530 | 11/1986 | Japan ............................. 437/209 |
| 62-1238 | 1/1987 | Japan ............................. 437/209 |
| 63-269539 | 11/1988 | Japan ............................. 437/209 |
| 64-7530 | 1/1989 | Japan ............................. 437/209 |
| 64-48436 | 2/1989 | Japan ............................. 228/904 |
| 1-211932 | 8/1989 | Japan ............................. 437/209 |

OTHER PUBLICATIONS

Tummala, et al., Eds. *Microelectronics Packaging Handbook*, Van Nostrand Reinhold, N.Y. (1989) pp. 403–405.
Chemical Abstracts 104(10): 73164q.
Chemical Abstracts 109(26): 241786k.
Chemical Abstracts 76(8): 38990e.

*Primary Examiner*—Olik Chaudhuri
*Assistant Examiner*—Andrew Griffis

[57] ABSTRACT

A method for looping the bond wires used to connected a semiconductor bond pad to a lead frame finger during bonding to improve the clearance between adjacent bond wires.

9 Claims, 2 Drawing Sheets

WIRE LOOPING METHOD DURING WIRE BONDING

FIELD OF THE INVENTION

The invention relates to wire bonding of semiconductor devices, and more particularly to a method of wire looping during wire bonding to improve clearance between adjacent wires.

BACKGROUND OF THE INVENTION

High density integrated semiconductor devices present challenging design problems in that many connections have to be made to the device. The semiconductor chip with bond pads around it outer edges is placed in a lead frame and the bond pads are wire bonded to the lead frame fingers. Many times the fit between the device bond pads and the lead frame is not ideal. The device may be placed in a lead frame that was designed for another device.

In other instances, the device bond pad locations can not be optimized because of design restrictions. The corner wires in some designs are difficult to place because of the angle of the wire leaving the bond pad. Two adjacent wires may become too close to one another causing wire shorting after molding. This problem is particularly difficult in devices where two or more wires are grouped in the corner positions of the semiconductor chip.

Present methods of wire bonding attach a ball on the end of the bond wire to the bond pad, feed out sufficient wire to reach the lead frame finger and bond the wire to the lead frame finger in a direct path. Wires that are not straight, that lean or curved are usually suspect as defective.

SUMMARY OF THE INVENTION

The invention is to a method of redirecting wire connections from the bond pad on a semiconductor chip during bonding to the lead frame lead finger to prevent one bond wire from shorting to an adjacent bond wire.

The method includes leaning a bond wire in a direction such that its path from the bond pad to the lead frame finger does not come too close to an adjacent bond wire.

The problem be may identified visually, or may be identified by mapping the chip and lead frame, and locating the paths between bond pads and the respective lead frame finger. If during inspection or mapping, a path is identified that would cause a bond wire to come too close to another bond wire, then, by software programming, the problem lead wire may be directed away from the problem area to eliminate the problem. The wire location adjustment is made in the way the bond head loops the bond wire as wire is feed out after the bond is made to the bond pad.

Since the problem occurs most commonly for corner connections, inspection and mapping may be limited to the corner bond wire paths for most devices.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
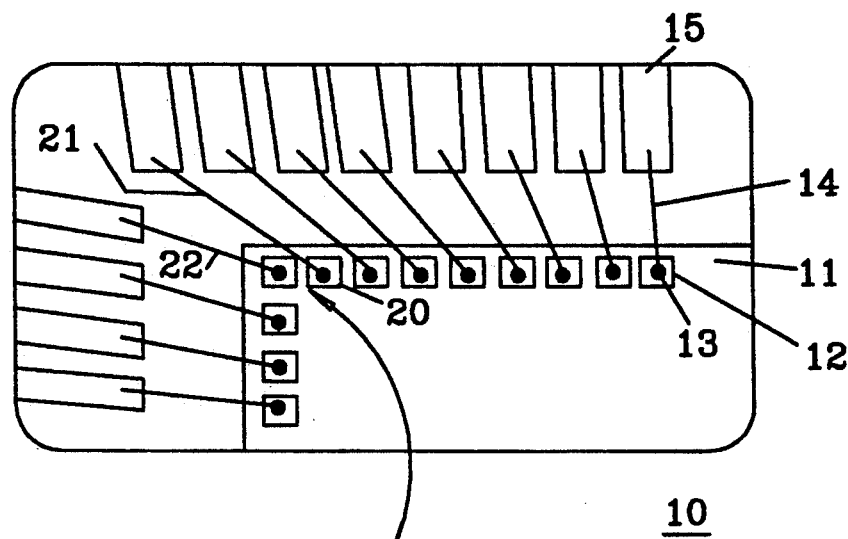
FIG. 1 is a partial view of a semiconductor chip wire bonded to a lead frame.

FIG. 1 is a partial enlarged view 10 of a semiconductor chip mounted on a header. Semiconductor chip 11 has a plurality of bond pads 12 along the edge thereof. Each bond pad has a ball bond 13 connected to a bond wire 14 which extends to a lead frame finger 15. A bond pad indicated at 20 has a bond wire 21 extending to a lead frame finger 15. Bond wire 21 extends across the adjacent bond pad 22a.

Figures 2, 6:
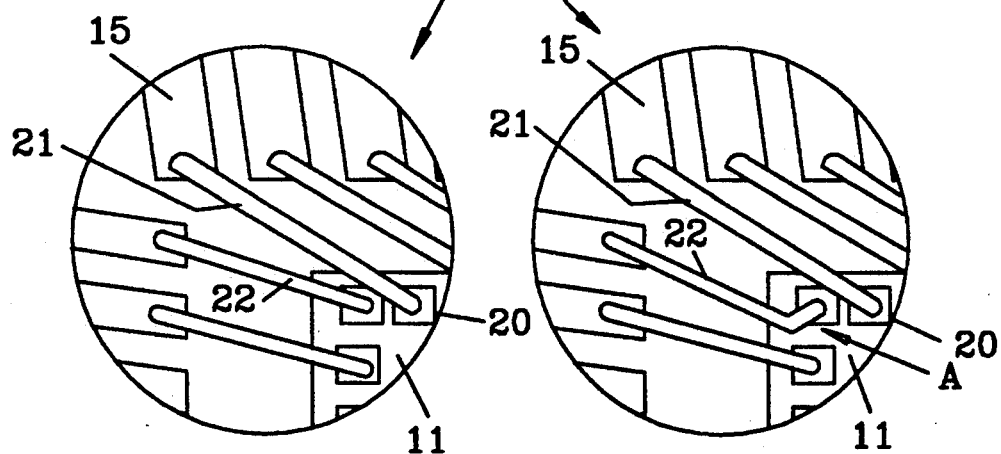
FIG. 2 is an enlarged portion of FIG. 1 illustrating a bond wire crossing an adjacent bond pad.
FIG. 6 is an enlarge portion of FIG. 1 showing a repositioned bond wire.

FIG. 2 is an enlarged portion of FIG. 1 illustrating the close proximity of bond wire 21 to bond wire 22. It is possible that bond wire 21 could electrically contact bond wire 22 causing a short circuit.

Figure 3:
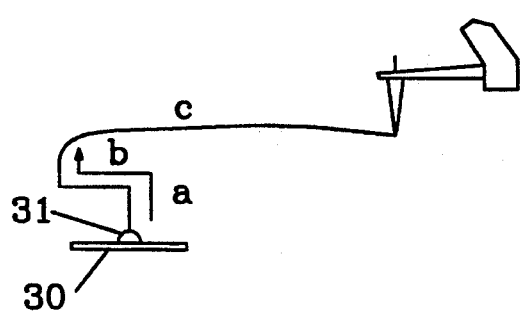
FIG. 3 is a drawing illustrating bond head motion in extending a bond wire to a lead finger.
Figure 3A:
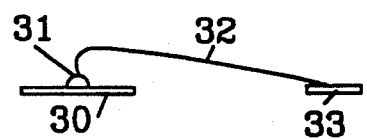
FIG. 3a shows a bond wire connected between a bond pad and a lead frame finger.

FIG. 3 is an exaggerated diagram of the motion of a bond head after bonding the ball end of a bond wire to a bond pad. A ball bond 31 is made to a bond pad 30. The bond head is then raised vertically at "a", move horizontally back at "b", and then raised and moved back in a direction "c" toward the bond station and the lead frame finger to which the end of the bond wire is to be attached. The motion of the bond head spools out sufficient bond wire to extend the bond wire from the ball connection 31 to a lead frame finger 33. As pointed out above, the motion is exaggerated to show bond head motion. An example of an actual bond is illustrated in FIG. 3a. Bond wire 32 is ball bonded to bond pad 30 at 31 and the bond wire 32 extends and is bonded to lead frame finger 33. Only sufficient wire is spooled out to span the distance between bond pad 30 and lead frame finger 33.

Figure 4:
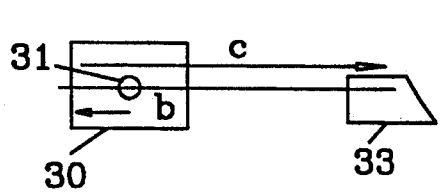
FIG. 4 is a drawing as in FIG. 3 showing top view of bond head motion.

FIG. 4 is a top view of the motion illustrated in FIG. 3. The motion direction "a" is vertical from the plane of the drawing. Motion direction b is horizontal and away from the direction of a lead frame lead finger. The bond head is then slightly raised and them moved horizontally to toward the lead frame lead finger to which the bond wire is to be attached.

Figure 5:
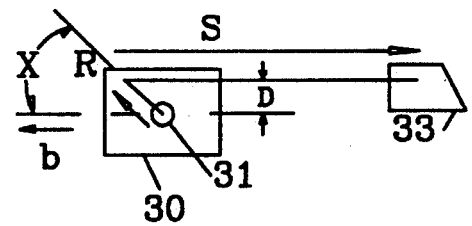
FIG. 5 is a drawing showing modified bond head motion to reposition bond wires.

FIG. 5 is a drawing illustrating the modified motion of the bond head according to the present invention. After the ball bond 31 is made to bond pad 30, the motion of the bond head is at an angle X to one or the other side of the motion direction indicated by the arrow "b". The motion in the direction "R" offsets the bond head by a distance "D" before the bond head moves in the direction "S" toward the lead frame lead finger 33. The offset "D" is determine by the amount of offset needed to move the bond wire away from an adjacent bond. This distance can be programmed in to a computer controlling the bond head when there is a similar offset needed in each of series of similar devices being bonded.

If there is a difference from device to device, the mapping of the lead frames, semiconductor chip and bond pad may be done for each device to determine if any offset is need for a particular device.

FIG. 6 is another enlarged view of part of FIG. 1. In FIG. 6, the bond wire 22 attached to bond pad 22a has an offset indicated at "A" to move bond wire 22 away from bond wire 21. The bond wire may be tilted in any direction and in varying degrees to position the bond wire such that a short between adjacent bond wires or a bond wire and adjacent bond pad does not occur.

What is claimed:

1. A method of wire looping with a wire bond head, during wire bonding of semiconductor devices to lead frames, to improve clearance between adjacent bond sites, including the steps of:

identifying at least one specific bond wire, the direction of which is to be altered;

moving the bond head in a direction to alter the path of the at least one specific bond wire to the lead frame, to move the identified at least one specific bond wire away from an adjacent bond wire prior to looping the identified at least one specific bond wire to the lead frame; and bonding the identified at least one specific bond wire to the lead frame.

2. The method according to claim 1, including the step of visually inspecting a semiconductor device and lead frame to determine which bond wire paths are to be altered.

3. The method according to claim 1, including the step of mapping the semiconductor device and lead frame to determine which bond wire paths are to be altered.

4. The method according to claim 3, including determining the altered paths of identified bond wires, based on the mapping of the semiconductor device and lead frame, and moving the bonder bond head in a direction to place the identified bond wires in the altered path.

5. The method according to claim 4, wherein the bond head is moved in a direction at an angle to the normal direction of the bond head to alter the path of the bond wire.

6. A method of wire looping with a wire bonder bond head, during wire bonding of semiconductor devices to lead frames, to improve clearance between adjacent bond wire, including the steps of:

identifying at least one specific bond wire, the direction of which is to be altered;

moving the bond head at an angle to the normal direction of the bond head to alter the path of the identified at least one specific bond wire to the lead frame, to move the identified at least one specific bond wire away from an adjacent bond wire prior to looping the identified at least one specific bond wire to the lead frame; and bonding the identified at least one specific bond wire to the lead frame.

7. The method according to claim 6, including the step of visually inspecting a semiconductor device and lead frame to determine which bond wire paths are to be altered.

8. The method according to claim 6, including the step of mapping the semiconductor device and lead frame to determine which bond wire paths are to be altered.

9. The method according to claim 8, including determining the altered paths of identified bond wires, based on the mapping of the semiconductor device and lead frame, and moving the bonder bond head in a direction to place the identified bond wires in the altered path.

* * * * *